United States Patent [19]

Martin

[11] Patent Number: 4,676,193

[45] Date of Patent: Jun. 30, 1987

[54] STABILIZED MASK ASSEMBLY FOR DIRECT DEPOSITION OF A THIN FILM PATTERN ONTO A SUBSTRATE

[75] Inventor: Richard T. Martin, Goleta, Calif.

[73] Assignee: Applied Magnetics Corporation, Goleta, Calif.

[21] Appl. No.: 755,951

[22] Filed: Jul. 15, 1985

Related U.S. Application Data

[63] Continuation of Ser. No. 583,481, Feb. 27, 1984, abandoned, which is a continuation of Ser. No. 283,180, Jul. 14, 1981, abandoned.

[51] Int. Cl.$^4$ ............................................. C23C 16/00
[52] U.S. Cl. .................................. 118/720; 118/721; 118/504; 118/505
[58] Field of Search ............... 118/720, 721, 565, 504, 118/715; 427/282

[56] References Cited

U.S. PATENT DOCUMENTS

| | | | |
|---|---|---|---|
| 2,969,296 | 1/1961 | Walsh | 118/720 X |
| 3,207,126 | 9/1965 | Byron | 118/721 |
| 3,230,109 | 1/1966 | Domaleski | 118/720 X |
| 3,241,519 | 3/1966 | Lloyd | 118/720 |
| 3,315,637 | 4/1967 | Taylor | 118/504 X |
| 3,574,012 | 4/1971 | Penberg | 118/504 |
| 4,372,248 | 2/1983 | Martin | 118/720 |

FOREIGN PATENT DOCUMENTS

43-18248  6/1968  Japan ................... 118/721

*Primary Examiner*—Richard Bueker

*Attorney, Agent, or Firm*—Daniel J. Meaney, Jr.

[57] ABSTRACT

A stabilized mask assembly for direct deposition of a thin film pattern onto a substrate having a dimensionally stabilized mask supporting frame which includes an opening extending therethrough and defining a surface extending circumferentially around the opening, a relatively thin, substantially planar mask having a predetermined yield strength and selected geometrical shape and dimension wherein the mask is positioned adjacent the opening with the periphery of the mask circumferentially contiguous the circumferentially extending surface and wherein the mask has at least one aperture extending therethrough and arranged in a predetermined location defining a thin film pattern, and a securing device for rigidly affixing the periphery of the mask to the circumferentially extending surface with a substantially uniform tension applied to and in the plane of the mask and wherein the tension has a magnitude which establishes a stress on the mask during use which is less than the predetermined yield strength of the mask over a temperature range of a deposition process including operating temperatures of a deposition environment and being adapted to maintain a tension thereon of sufficient magnitude to keep the mask under tension independent of variations in tension due to the thermal expansion characteristics of the mask to dimensionally stabilize the thin film pattern at the operating temperatures of a deposition environment is shown.

A method of fabricating a stabilized mask for direct deposition of a thin film pattern onto a substrate is also shown.

22 Claims, 26 Drawing Figures

Fig 20   $A' \neq A, B' \neq B, A' \neq B', x_2' \neq x_2$
$x_3' \neq x_4', x_3' \neq x_3, x_4' \neq x_4, x_1' \neq x_1, x_1' \neq x_2'$

STABILIZED MASK ASSEMBLY FOR DIRECT DEPOSITION OF A THIN FILM PATTERN ONTO A SUBSTRATE

This application is a continuation of application Ser. No. 06/583,481 filed Feb. 27, 1984, which is a continuation of Ser. No. 06/283,180, filed July 14, 1981, both are now abandoned.

BACKGROUND OF THE INVENTION

1. Field of the Invention

This invention relates to a stabilized mask assembly for use in generation of thin film patterns and more particularly to a stabilized mask assembly having a dimensionally stabilized mask supporting frame having a relatively thin, substantially planar mask, such as for example a metal foil, rigidly affixed thereto under substantially uniform tension for direct deposition of thin film patterns on a substrate in a vacuum deposition process.

2. Description of the Prior Art

Utilization of patterns of thin films in microelectronics is well known in the art. Many methods for generating thin film patterns are known in the art including the use of film deposition masks which are commonly used in an evaporation vacuum deposition process.

Typically, a vacuum deposition mask is fabricated using known etching or electroforming techniques for forming a plurality of apertures in a well-defined pattern. In use, the deposition mask having the well-defined pattern is positioned in close proximity to a substrate upon which a thin film of material formed into the pattern of the well-defined pattern is to be deposited. An evaporant vapor from a vapor deposition source passes through the deposition mask and condenses on the substrate in the form of the well-defined pattern of the deposition mask to form the thin film layer of material.

In certain of the known prior vacuum deposition processes used for the fabrication of certain electrical components, such as for example, fabrication of thin film transducers or discrete electrical components such as helical coils, it is necessary to deposit a plurality of thin film layers of materials in various patterns onto a substrate wherein each deposited layer must be accurately located in an exact position on the substrate and in a predetermined relationship to the prior deposited layers on the substrate.

In connection therewith, it is also known in the art that placing a deposition mask relative to a vapor deposition source in a vapor deposition process results in the mask being subjected to heating due to the type of source being used in the vapor deposition process. Typically, the heat radiated to a mask from a resistively heated boat or crucible type of evaporation source is high. In comparison, the use of an electron beam type of evaporation source results in a lower amount of heat being radiated to a deposition mask.

In the known vapor deposition processes, a deposition mask is subject to heating from at least four (4) possible sources; namely, (a) radiation from the vapor source; (b) heat of vaporization released by the evaporant vapor condensing on the mask itself; (c) the heated substrate and substrate holder located proximate to the deposition mask, and (d) the heated mask support.

The known deposition masks have been formed from metal foil and the so-formed deposition masks are susceptible to changes in operating temperatures during the deposition process. Typically, the metal foil deposition masks have a thin cross-section and as a result thereof, exhibit low conductivity of heat and low total heat capacity. As such, the metal deposition mask is highly susceptible to temperature changes resulting from variations in (a) thermal emissivity and thermal conductivity due to the presence of evaporation material collected on the mask; (b) heat input to the deposition mask due to variations in the rate of condensation of evaporate material onto the deposition mask; and (c) thermal radiation from the source.

All of the above has the net effect of causing variations in the dimensions of the known deposition mask during the deposition process which results in an inability to precisely control registration and accurate dimensions of the resulting thin film deposited layer or layers.

Further as a result of the deposition mask being exposed to heating, it is known in the art that typically the deposition mask itself expands, the exact amount thereof being determined by the thermal expansion characteristics and the temperature change of the deposition mask itself.

The expansion of the deposition mask is known to have a thermal expansion effect which causes the well-defined pattern to be enlarged due to the expansion of the deposition mask at the operating temperatures of the deposition process.

Descriptions of the prior film deposition through masks and the methods and techniques for fabricating the same are disclosed in greater detail in a book entitled HANDBOOK OF THIN FILM TECHNOLOGY, Edited by Leon I. Maissel and Reinhard Glang, McGraw Hill Book Company, New York, New York, 1970, at Chapter 7 thereof entitled "Generation of Patterns in Thin Films" by Reinhard Glang and Lawrence V. Gregor at pages 7-1 to 7-10.

One technique for producing a thin film magnetic transducer using a vapor deposition process including deposition through a deposition mask is disclosed in U.S. Pat. No. 3,867,868 to Lazzari. In fabrication of a thin film transducer having pole piece layers and one or more winding layers, any one of several techniques can be used in an attempt to precisely control the width, length, depth and registration of the various layers relative to the prior deposited and post deposited layers. The apparatus utilized in fabricating such thin film transducers relied solely on the use of mask-carriage assembly which functionally attempted to index and accurately position a specific deposition mask pattern relative to a substrate.

SUMMARY OF THE INVENTION

This invention relates to a new, novel and unique stabilized mask assembly for direct deposition of a thin film pattern on a substrate wherein the mask, which in the preferred embodiment is a metal foil, is dimensionally stabilized at the operating temperatures of a vapor deposition process. In addition, this invention relates to a new and novel method for fabricating a dimensionally stabilized deposition mask. In the preferred embodiment, the stabilized mask assembly is adapted for direct depositing a thin film pattern onto a substrate. The stabilized mask assembly includes a dimensionally stabilized mask supporting frame having an opening extending therethrough and means defining a surface extending circumferentially around the opening. A relatively thin, substantially planar mask having a predetermined yield strength and selected geometrical shape and dimension, is positioned adjacent the opening with the periphery of the mask circumferentially contiguous the circumferentially extending surface. The mask has at least one aperture extending therethrough which is arranged in a predetermined location defining a thin film pattern. A means is provided for rigidly affixing the periphery of the mask to the circumferentially extending surface with an initial substantially uniform tension applied to and in the plane of the mask. The value of the initial substantially uniform tension has a magnitude which establishes a stress on the mask during use which is less than the predetermined yield strength of the mask over a temperature range of a deposition process including operating temperatures of a deposition environment. The initial tension is also adapted to maintain tension on the mask of sufficient magnitude to keep the mask under tension independent of variations in tension due to the thermal expansion characteristics of the mask to dimensionally stabilize the thin film pattern at the operating temperatures of a deposition environment.

The present invention overcomes several of the disadvantages of the prior apparatus and methods. The prior art mask-carriage assembly, which attempted to simultaneously index and accurately register a deposition mask to a substrate, did not compensate for dimensional variations in the deposition mask due to the thermal expansion characteristics of the deposition mask arising from variations in the operating temperatures of a deposition process. In operation, variations in the operating temperature of the deposition process directly caused the deposition mask to change its dimension. Thus, the deposition mask was not dimensionally stabilized at the operating temperatures of the deposition process and, as such, directly was the cause of and contributed directly to misregistration of the prior deposited and post deposited layers on a substrate requiring multiple thin film layers of material to be deposited thereon in a predetermined sequence in order to form a desired component.

Another serious disadvantage of the prior art deposition masks is both the deposition mask support and deposition mask were thermally unstabilized. As the deposition mask in the prior art changes in temperature, the deposition mask support and the depositon mask itself could expand or contract at different rates and in different amounts depending on the thermal expansion characteristics determined by the thermal expansion coefficients of the material forming the same. In the known prior art assemblies, the varying thermal environment causes the mask to be displaced relative to the mask support changing the mask to substrate distances. Displacement of the mask relative to the mask support with the mask overconstrained thereto results in a "buckling" effect wherein the mask essentially grows in size larger than its constraints and, due to the constraints, causes the mask to be displaced from its nominal or intended plane which effectively changes the mask-to-substrate distance.

Other mask displacements are caused by localized thermal gradients in the mask and bi-metal effects imposed on the mask itself. Specifically, if the mask has a thermal gradient across its surface, localized differential thermal expansion results. Depending on the magnitude of the thermal gradient, the hotter localized areas of the mask will "bulge" relative to the nominal plane causing a shifting of the mask surface from its nominal or intended plane. As a result of the mask "bulge", certain portions of the mask-to-substrate distance will change even though other portions of the mask-to-substrate distance may remain unchanged.

Mask displacement may occur because of the mask being constructed from two or more metals using known bi-metal mask construction technique such as, for example, electroforming. Also, during use of the mask in a vapor deposition process dissimilar metals may be condensed on the surface of the mask and the dissimilar materials react in response to temperature variations.

Thus, the bi-metal constructed mask and/or the deposited material on the mask essentially results in dissimilar metals having different coefficients of expansion being joined together. Changes in operating temperature cause unequal expansion of the joined metal layers which result in the "bowing" or "warping" of the mask causing a change in the mask-to-substrate distance.

All of the above results in a change of the deposition mask-to-substrate distance. A change in the deposition mask-to-substrate distance grossly affects the shape of the edge of the deposited layer and the overall registration, dimension and location of the deposited layer or layers.

Thus, the known prior art deposition masks are dimensionally thermally unstabilized at the critical operating temperatures of a deposition process thereby making accurate and precise registration of prior-deposited and post-deposited layers extremely difficult, unpredictable and almost impossible. Also, similar problems are encountered in attempting to precisely dimensionally control a single deposited layer.

Further, depending on the construction of a deposition mask support frame, the environment of vapor deposition process in which the same is to be used and the material used therein, the deposition mask supporting frame of the prior assemblies are likewise dimensionally thermally unstable which further complicates the accuracy and registration problems in depositing a single layer or plurality of thin film layers of material onto a substrate.

The present invention overcomes the disadvantages of the known prior devices. One advantage of the present invention is that the stabilized mask assembly utilizes a dimensionally stabilized mask supporting frame for supporting a deposition mask.

Another advantage of the present invention is that a deposition mask is formed of a relatively thin, substantially planar mask material having a predetermined yield strength. The mask is rigidly affixed to the stabilized mask supporting frame with a radial tension applied thereto.

Yet another advantage of the present invention is that a uniform tension on the mask inhibits the mask, which in the preferred embodiment is formed of metal foil, from buckling, bowing, bulging, warping or exhibiting bi-metallic distortion due to the accumulation of evaporation material on the mask surface, the mask construction, localized thermal gradients applied to the mask and mismatching in coefficients of thermal expansion. The substantially uniform tension can be applied in a number of ways to the mask such that the mask is maintained in a flat planar condition and thereby in a predetermined position relative to the plane of the dimensionally stabilized mask supporting frame. Maintaining the mask in a predetermined position relative to the dimensionally stabilized mask supporting frame permits the mask-to-substrate distance to be precisely established and maintained by controlling the distance between the dimensionally stabilized mask supporting frame and the substrate.

A further advantage of the present invention is that the dimensionally stabilized mask supporting frame can be fabricated of a material which does not significantly expand over the operating temperature ranges of a deposition process or, if formed of a material which does expand due to its thermal expansion characteristics being responsive over the range of temperatures of the deposition process, that such material can be thermally stabilized at the operating temperatures of the vapor deposition environment.

A still further advantage of the present invention is that the material forming the relatively thin, substantially planar mask is selected to have a sufficiently high predetermined yield strength and selected geometrical shape and dimension.

A still yet further advantage of the present invention is that the relatively thin, substantially planar mask can be rigidly affixed to the periphery of the dimensionally stabilized mask supporting frame under an initial substantially uniform tension having a magnitude which establishes a stress on the mask during use which is less than the predetermined yield strength of the mask over a temperature range of the deposition process including operating temperatures of the deposition process.

A still yet further advantage of the present invention is that the dimensionally stabilized mask supporting frame can be selected of a material which has a thermal coefficient of expansion which is higher than, substantially equal to, or less than the material forming the mask, the exact relationship between the thermal coefficient of expansion of the dimensionally stabilized mask supporting frame and the mask being selected as a function of the deposition process, its operating temperatures, the characteristic of the material forming the mask and other such variables.

A still yet further advantage of the present invention is that the stabilized mask supporting frame can be utilized in combination with prealigned registration members located on the flange of a dimensionally stabilized mask supporting frame to form a mask supporting apparatus.

A still yet further advantage of the present invention is that the mask supporting apparatus which includes a stabilized mask assembly having a dimensionally stabilized mask supporting frame and a relatively thin, substantially planar mask formed of a material having a predetermined yield strength and selected geometrical shape and dimension and prealignment registration members can be combined with a gantry means which includes a substrate holding means for supporting a substrate in a predetermined relationship to the source so as to form an apparatus for accurately registering a substrate to a stabilized mask for direct deposition of a thin film material thereon through the stabilized mask having a thin film pattern formed therein.

A still yet further advantage of the present invention is that means can be utilized for heating and maintaining the substrate, substrate holding means and the dimensionally stabilized mask supporting frame at selected stabilized operating temperatures.

A still yet further advantage of the present invention is that the substrate and substrate holder can be heated to a temperature which is higher than the temperature which the dimensionally stabilized mask supporting frame would achieve in the deposition process independent of any heating means and then the dimensionally stabilized mask supporting frame and planar mask can be heated to a temperature substantially equal to that of the substrate and substrate holder insuring that the deposited layer of thin film material formed into the thin film pattern will have a high degree of adherence to the substrate and selected physical properties. This also results in maximum thermal and dimensional stability in the system.

A still yet further advantage of the present invention is a method for fabricating a dimensionally stabilized mask assembly, which mask assembly is adapted for direct deposition of a thin film pattern onto a substrate in a vapor deposition environment.

A yet further advantage of the present invention is that a method of thermally dimensionally stabilizing a mask having a thin film pattern formed thereon can be utilized during the vapor deposition process.

A yet further advantage of the present invention is that the dimensionally stabilized mask supporting frame has sufficient structural rigidity such that the mask undergoes the strain during use while the dimensionally stabilized mask supporting frame experiences only insignificant strain and essentially remains structurally rigid during use and as the mask experiences changes in stress.

A still yet further advantage of the present invention is that the dimensionally stabilized mask supporting frame is sufficiently massive such that it can be uniformly heated and temperature stabilized at selected operating temperatures during use.

BRIEF DESCRIPTION OF THE DRAWING

The foregoing and other advantages and features of this invention will be apparent from the following description of the preferred embodiment when considered together with the illustrations in the accompanying drawings which include the following figures:

FIGS. 15a and 15b are enlarged partial sectional views of a substrate supporting means for holding a relatively thick substrate in position on the substrate holding means which is part of the gantry means;

DESCRIPTION OF THE PREFERRED EMBODIMENT

Figure 1:
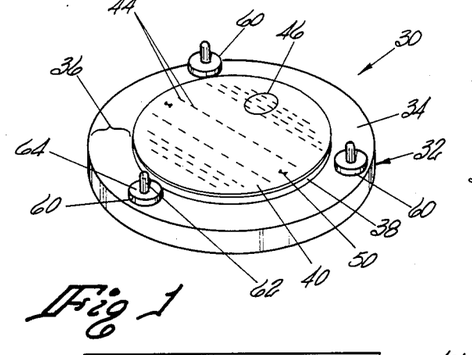
FIG. 1 is a perspective view of a mask supporting apparatus which includes a stabilized mask assembly and prealigned registration members.

FIG. 1 illustrates in a perspective view a mask supporting apparatus shown generally by arrow 30 which is adapted for direct deposition of a thin film pattern on a substrate. The mask supporting apparatus 30 includes a stabilized mask assembly shown by arrow 32 having a dimensionally stabilized mask supporting frame 34 which has an opening extending therethrough, which is shown as opening 70 in FIG. 2, and means defining a surface extending circumferentially around the opening. In the preferred embodiment, the means defining a surface extending circumferentially around the opening is in the form of a flange 36 which terminates in a raised ridge 38.

Figure 2:
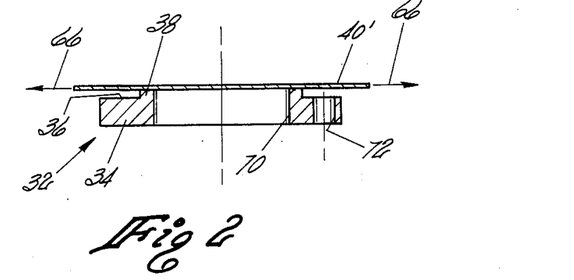
FIG. 2 is an end elevational view in cross-section showing a step for rigidly affixing the periphery of metal foil to the dimensionally stabilized mask supporting frame.

A relatively thin, substantially planar mask 40, illustrated in FIG. 1, having a predetermined yield strength and a selected geometrical shape and dimension is positioned adjacent the opening 70 shown in FIG. 2.

In FIG. 1, the planar mask 40 is rigidly affixed to the periphery of the raised ridge 38 such that the periphery of the mask is positioned adjacent the opening 70 and is circumferentially contiguous the circumferentially extending surface. The mask has at least one aperture 44 which extends therethrough and which is arranged in a predetermined location defining a thin film pattern illustrated by pattern 46.

In the preferred embodiment, the flange 36 of the dimensionally stabilized mask supporting frame 34 defines or terminates in a raised ridge 38 which is located around the periphery of the opening 70 illustrated in FIG. 2. Means are provided for rigidly affixing the periphery of the mask 40 to the circumferentially extending surface with a substantially uniform tension applied to and in the plane of the mask.

For purposes of clarity, the mask 40 shall refer to the final mask rigidly affixed to the dimensionally stabilized mask supporting frame 34. The metal foil sheet to be used in fabricating the final metal mask 40, as illustrated in FIG. 1, shall be referred to as metal foil 40'.

FIG. 2 illustrates a metal foil 40' having a predetermined yield strength and a selected geometrical shape and dimension which is held under a substantially uniform or isotropic tension applied to and in the plane of the metal foil 40' as depicted by arrows 66. An initial substantially uniform tension is applied to the metal foil 40' during fabrication. The initial substantially uniform tension has a magnitude which establishes a stress on the mask 40 (shown in FIG. 1) during use which is less than the predetermined yield strength of the mask 40 over a temperature range of a deposition process including operating temperatures of a deposition environment.

The mask 40 has a tension applied thereto which is of sufficient magnitude to keep the same under tension independent of variations in tension due to the thermal expansion characteristics of the mask 40 during the deposition cycle to dimensionally stabilize the thin film pattern 46 to dimensions established by the dimensionally stabilized mask supporting frame 34 at the operating temperature of a deposition environment.

In the preferred embodiment, the dimensionally stabilized mask supporting frame is formed of a material which has a thermal expansion coefficient which is slightly less than that of the metal foil mask. In the preferred embodiment, typical initial tension shown by arrows 66, is in the order of one thousand (1,000) pounds per square inch was found to be satisfactory. In a vapor deposition process at typical deposition temperatures and in a vacuum in the order of $10^{-5}$ to $10^{-8}$ torr, the tension or stress in the metal foil could exceed one hundred thousand (100,000) pounds per square inch. One embodiment of a material which is adapted for use in practice of the invention for the mask 40 was full hard 304 stainless steel which has a yield strength of approximately two hundred thousand (200,000) pounds per square inch.

In the preferred embodiment illustrated in FIG. 2, the means for rigidly affixing the periphery of the metal foil mask 40' to the circumferentially extending surface of a dimensionally stabilized mask supporting frame 34 is a weld which is integral with the circumferentially extending surface and the metal foil 40'. One means utilized for performing the welding step is a controlled laser beam.

The thin film pattern 46 illustrated in FIG. 1 which is defined by the apertures 44 can be formed in a number of known ways. For example, the apertures 44 defining the thin film pattern 46 can be fabricated by single or double-sided etching. This can be performed either on a foil sheet, such as for example, sheet 40' illustrated in FIG. 2 prior to the same being rigidly affixed to the dimensionally stabilized mask supporting frame under a substantially uniform tension applied to the mask and in the plane of the mask or, can be formed in the foil after it is rigidly affixed to the dimensionally stabilized mask supporting frame 34. In addition to the thin film pattern 46, an alignment target means 50 can be formed into the mask to be used for mask alignment purposes.

It is envisioned that the dimensionally stabilized mask supporting frame 34 could be formed of material which remains at substantially the same dimensions without undergoing significant thermal expansion over the temperature range of a deposition process. One such material is quartz or Invar. The mask may be formed of material other than a metal foil and one such material is a polyimide which exhibits excellent high temperature properties, one example of which is Kapton manufactured and sold by Dupont.

The stabilized mask assembly 32 is adapted to have supporting apertures 72 which are adapted to support prealigned registration members shown generally as 60 in FIG. 1. The prealigned registration members 60, in the preferred embodiment, include a registration pin 62 and adjusting means, which in the preferred embodiment are eccentric members 64, which are optimally coupled to the registration pin 62 and to the frame flange of the dimensionally stabilized mask supporting frame 34. The adjusting means 64 is adapted to movably and adjustably secure registration pins 62 relative to the frame flange 36 and is adapted to adjust the registration pins 62 relative to the thin film pattern 46. The mask supporting apparatus 30 comprises the stabilized mask assembly 32 together with the prealigned registration members 60 which are located in the supporting apertures 72.

Figure 3:
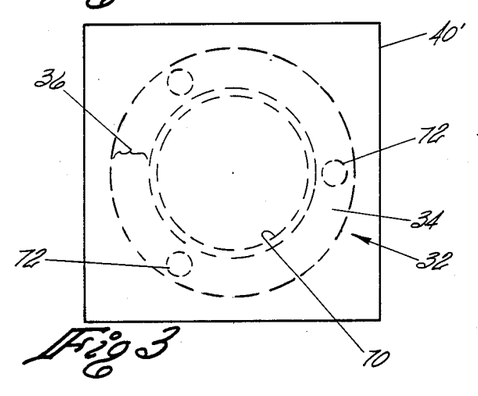
FIG. 3 is a top plan view of a relatively thin, substantially planar mask having a substantially uniform tension applied thereto positioned over the dimensionally stabilized mask supporting frame.

FIG. 2 illustrates pictorially by means of arrows 66 that the relatively thin, substantially planar metal foil 40' is subject to a substantially uniform tension applied to and in the plane of the mask. As shown in FIGS. 2 and 3, the dimensionally stabilized mask supporting frame 34 is positioned contiguous the tensioned or stretched metal foil 40' such that the metal foil 40', under tension, can be rigidly affixed to the circumferentially extending surface of the dimensionally stabilized mask supporting frame 34.

FIGS. 2 through 6, inclusive, disclose a method for fabricating a stabilized mask assembly 32 adapted for direct deposition of a thin film pattern on a substrate. In the preferred embodiment, the method includes a step of applying a substantially uniform tension, such as a substantially uniform radial tension, to a metal foil 40' having a predetermined yield strength and selected geometrical shape and dimension. In FIGS. 2 and 3, the metal foil 40' is adapted to have a substantially uniform tension or stretching force applied to the edges thereof by using known clamping and stretching techniques.

Figure 7:
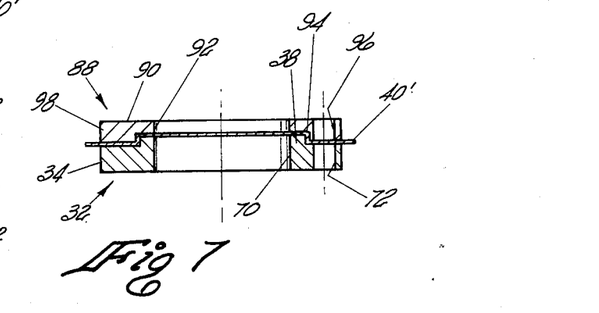
FIG. 7 is a sectional elevational view of a stabilized mask assembly having a clamping member for mechanically clamping a substantially planar mask to the dimensionally stabilized mask supporting frame.

In the alternative, it is possible to mechanically clamp and stretch the metal foil 40' by use of a mechanical member which is illustrated in FIG. 7. This will be discussed in greater detail with respect to FIG. 7. Of importance is, that a radial tension can be applied in a number of ways to the substantially metal foil 40'.

The method includes a step of rigidly affixing the metal foil 40' to a circumferentially extending surface which, in the preferred embodiment, is a raised ridge 38. The metal foil 40' is positioned relative to the dimensionally stabilized mask supporting frame 34 adjacent to the opening which is extending therethrough. By selecting the geometrical size and shape of the metal foil 40', the metal foil 40' extends beyond the edges of the dimensionally stabilized mask supporting frame 34 such that the edges thereof can be utilized for stretching the metal foil 40'. The value of the initial radial tension applied to metal foil 40' is selected such that the magnitude of stress imposed thereon is of a value such that the mask 40, produced from the metal foil 40', has a magnitude of stress imposed thereon during use which is less than the predetermined yield strength of the mask 40 over a temperature range of a deposition process including operating temperatures of a deposition environment.

Figures 4, 5:
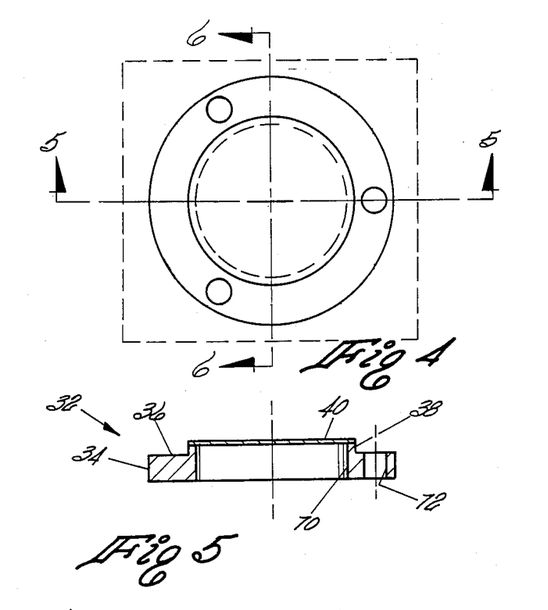
FIG. 4 is a top plan view of a stabilized mask assembly having the relatively thin, substantially planar mask rigidly affixed to the dimensionally stabilized mask supporting frame.
FIG. 5 is a section of the stabilized mask assembly taken along section lines 5-5 of FIG. 4.
Figure 6:
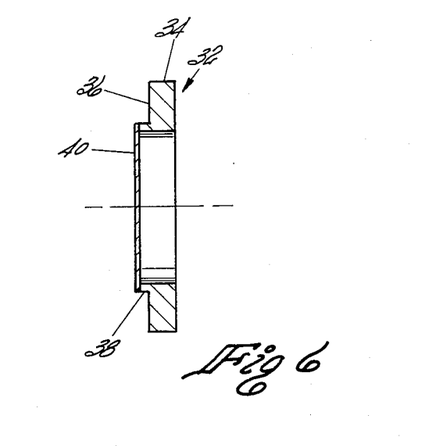
FIG. 6 is a section view of the stabilized mask assembly taken along section lines 6-6 of FIG. 4.

FIGS. 4, 5 and 6 illustrate a completed stabilized mask assembly 32. The stabilized mask assembly 32 includes a dimensionally stabilized mask supporting frame 34 having a flange 36 and a raised ridge 38 located on the flange 36 with the raised ridge positioned around opening 70. In the preferred embodiment, the metal foil 40' is welded to the raised ridge 38 with the metal foil 40' under tension, as illustrated in FIG. 2, such that when the stabilized mask assembly 32 is completed, the weld and the dimensionally stabilized mask supporting frame 34 maintains the mask 40 under tension. Supporting apertures 72, which are adapted to support the adjusting means 64 for supporting the registration pin 62 have the axis thereof in substantial parallel alignment with the axis of the opening 70.

The stabilized mask assembly 32 can be utilized together with a clamping member shown generally as 88 in FIG. 7. In operation, the metal foil 40' is positioned over the opening 70 as illustrated in FIG. 7. The clamping member 88 has an outer support flange 90 and means for defining a clamping member opening shown generally as 92 which extends therethrough. The clamping member opening 92 has a geometrical dimension which is substantially equal to the geometrical dimension of the opening 70 of the dimensionally stabilized mask supporting frame 34. The outer support flange 90 has one end thereof which terminates in a raised boss member 98 which defines a clamping member counterbore 94. The clamping member counterbore has a geometrical dimension substantially equal to the sum of the dimension of the opening 70 of the dimensionally stabilized mask supporting frame 34, twice the width of the circumferentially extending surface around the periphery of the opening 70, such as for example, the width of the raised ridge 38 in the dimensionally stabilized mask supporting frame 34 and an allowance for the thickness of the metal foil 40' to be clamped thereby. The clamping member counterbore 94 is adapted to slidably mate with the circumferentially extending raised ridge 38 with the periphery of the metal foil 40' therebetween. The clamping member 88 clamps the periphery of the metal foil 40' between the outer support flange 90 and the dimensionally stabilized mask supporting frame 34 to establish and maintain a radial tension in the metal foil 40' which ultimately forms the mask 40. The clamping member 88 includes a supplemental clamping aperture 96 which is adapted to have its center axially aligned with the axis of supporting aperture 72. The adjusting means 64 would then be mounted and extended through supporting aperture 72 and supplemental supporting aperture 96.

In operation, the use of a clamping member 88 together with the dimensionally stabilized mask supporting frame 34 provides a means for mechanically forming a tension in the metal foil 40' such that the clamping action stretches the mask forming the radial tension therein over the opening 70 and the clamping member counterbore 94 cooperates with the dimensionally stabilized mask supporting frame 34 to clamp and hold the metal foil 40' in position at the predetermined tension.

In operation, the mask supporting apparatus 30 including the stabilized mask assembly 32 which includes the dimensionally stabilized mask supporting frame 34 and the relatively thin, substantially planar mask 40 receives heat from four (4) different sources. The four sources of heat which can effect the operating temperatures of the relatively thin, substantially planar mask 40 are: (a) radiation from the vapor source; (b) heat of vaporization released by the evaporate vapor condensing on the mask 40 itself; (c) the heated substrate and substrate holder located proximate the mask 40; and (d) heat applied to the dimensionally stabilized mask supporting frame 34. During a deposition process, the dimensionally stabilized mask supporting frame 34 will achieve certain operating temperatures independent of any external heating means. The operating temperature range would have a maximum operating temperature and would be the maximum temperature the dimensionally stabilized mask supporting frame 34 would achieve in the deposition process independent of any external heating means.

Figure 8:
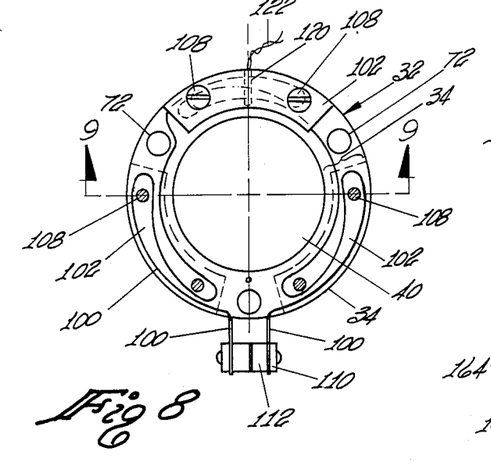
FIG. 8 is a bottom plan view of a heating assembly located on the flange of a dimensionally stabilized mask supporting frame.

FIG. 8 illustrates a method for thermally dimensionally stabilizing the dimensionally stabilized mask supporting frame 34. This is accomplished by use of means operatively coupled to the dimensionally stabilized mask supporting frame 34 for heating the same to a selected operating temperature. At the selected operating temperature, the dimensionally stabilized mask supporting frame 34 maintains a radial tension force on the mask 40 independent of variations in radial tension due to the thermal expansion characteristics of the mask 40 at the operating temperatures in a deposition environment. In the embodiment illustrated in FIG. 8, the means for heating the flange of the dimensionally stabilized mask supporting frame 34 includes a heater formed of heating element 100 which is mounted within heater element clamping housings 102 which are secured to the flange of the dimensionally stabilized mask supporting frame 34 through fasteners 108. The heating element 100 is formed into a predetermined zigzag-type of pattern within the interior of the heater element clamping housings 102 and extends around the fasteners 108 to form a substantially uniform heating surface for the dimensionally stabilized mask supporting frame 34. In the preferred embodiment, the dimensionally stabilized mask supporting frame 34 has three (3) heater element clamping housings 102 as illustrated in FIG. 8. The heating element 100 is a continuous heating element which extends from a connector 110 which includes an insulating support 112 such that the two ends of the heating element 100 extend from the periphery of the dimensionally stabilized mask supporting frame 34 and are adapted to be connected to an external source of current and voltage for the heater. In the preferred embodiment, the dimensionally stabilized mask supporting frame 34 was formed of 321 stainless steel material, the heating elements were formed of ARI Aero Coax electric heating cable having an outside diameter of 1.5 mm and is capable of dissipating 50 watts. This power is more than suffficient to maintain the temperature of the dimensionally stabilized mask supporting frame 34 at temperatures in the range of temperatures typical of vacuum deposition processes and in excess of the maximum temperature that the dimensionally stabilized mask supporting frame 34 would reach independent of the heating means.

FIG. 8 also illustrates that a temperature sensor 120 can be mounted within the interor of the dimensionally stabilized mask supporting frame 34 so as to sense the temperature thereof. Leads 122 are adapted to operatively connect the temperature sensor 120 to a heat control system.

Figure 9:
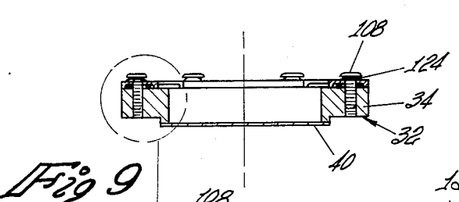
FIG. 9 is an end elevational sectional view of the stabilized mask assembly taken along section lines 9—9 of FIG. 8.
Figure 10:
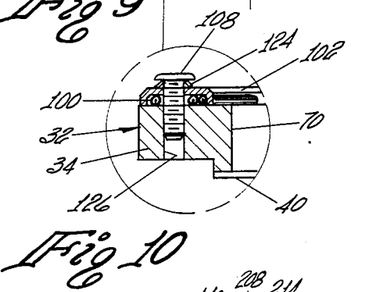
FIG. 10 is an exploded representation of a fastener to secure a heater to the flange of the dimensionally stabilized mask supporting frame of FIG. 9.

FIG. 9 illustrates by cross-section the construction of the heating means on the stabilized mask assembly 32. FIG. 10 shows in greater detail the relationship between the stabilized mask assembly 32 which includes the relatively thin, substantially planar mask 40, the dimensionally stabilized mask supporting frame 34, the heating element 100, the heater element clamping housings 102 and the fasteners 108. The fasteners 108 are adapted to maintain the heating element clamping housings 102 in a flexible position to permit expansion and contraction of the heater element clamping housing 102 and the heating element 100 therein by use of spring washers 124.

FIG. 10 shows the detailed relationship between the dimensionally stabilized mask supporting frame 34, the heating element 100, the heater element clamping housings 102, the fasteners 108, and the spring washers 124.

During the heating of the dimensionally stabilized mask supporting frame 34 by the heating element 100, the heating element 100 will experience thermal expansion and contraction. Therefore, the heater element clamping housings 102 will likewise experience expansion and contraction which results in movement thereof relative to the fasteners 108. In order to provide a means for accommodating this movement, the heating element 100, heater element clamping housings 102 and the spring washers 124 are adapted to cooperate with the fasteners 108 to permit the thermal expansion and contraction to occur therebetween such that the heating element 100 maintains firm contact with the dimensionally stabilized mask supporting frame 34 to insure good thermal conductivity therebetween.

The use of a means for heating the dimensionally stabilized mask supporting frame 34, illustrated in FIG. 8, provides a means to heat the flange of the dimensionally stabilized mask supporting frame 34 to an operating temperature which is in excess of the maximum operating temperature that the dimensionally stabilized mask supporting frame 34 would reach on its own during the deposition process. By use of a heating means, the temperature of the dimensionally stabilized mask supporting frame 34 can be very carefully controlled by the addition of heat to insure that a selected operating temperature can be maintained which is possible through the use of a heating and maintaining means illustrated in FIG. 24.

A temperature sensor 120, which is an element of the heating and maintaining means, performs the function of sensing the temperature of the dimensionally stabilized mask supporting frame 34. By utilizing the sensed temperature, the heating and maintaining means can be utilized to precisely maintain the dimensionally stabilized mask supporting frame 34 at a selected operating temperature which is in excess of the maximum operating temperature described above. By maintaining the operating temperature of the dimensionally stabilized mask supporting frame 34 at a selected operating temperature, the dimensional stabilized mask supporting frame 34 will have a known or determinable dimension at that selected operating temperature. Since the mask 40 is stretched to the dimension of the comparatively rigid dimensionally stabilized mask supporting frame 34 and is rigidly affixed thereto under a substantially uniform tension, the mask 40 will be maintained at dimensions controlled by the dimensionally stabilized mask supporting frame 34 in spite of or independent of the temperature variation in the mask 40 during the deposition process. This provides two possible modes of operation.

The first mode is to maintain the dimensionally stabilized mask supporting frame 34 at a process determined operating temperature which is reproducible or repeatable. The process determined operating temperature then fixes the dimension of the relatively thin, substantially planar mask 40 relative to the dimensionally stabilized mask supporting frame 34. Thus, by operating the dimensionally stabilized mask supporting frame 34 at precisely the same process determined operating temperature during the same or subsequent vapor deposition processes, the thin film pattern 46 (shown in FIG. 1) on the mask 40 is automatically dimensionally stabilized relative to the dimensionally stabilized mask supporting frame 34. By selecting and maintaining the operating temperature of the dimensionally stabilized mask supporting frame 34 at the process determined operating temperature, a repetitive thin film pattern 46 having the same dimension can be achieved with a high degree of precision.

The second mode is to determine the exact dimension of the thin film pattern on the relatively thin, planar mask 40 at a selected operating temperature of the dimensionally stabilized mask supporting frame 34. By regulating the dimensionally stabilized mask supporting frame 34 at the selected operating temperature, the predetermined exact precise dimension of a thin film pattern 46 can be accurately controlled and selected during an operation in a deposition process.

By use of the heating means for maintaining the dimensionally stabilized mask supporting frame 34 at a selected operating temperature, a number of possibilities exist to precisely control and dimensionally stabilize the thin film pattern 46 on the mask 40 relative to the dimensionally stabilized mask supporting frame 34. In operation, the selection of the thermal coefficient of expansion of the material which is utilized to form the dimensionally stabilized mask supporting frame 34 and of the material utilized to form the relatively thin, substantially planar mask 40 is crucial, depending on the type of operation, for the following reasons. Depending on the deposition process and the material, three possible combinations exist for the selection of appropriate materials.

In the preferred embodiment, the thermal expansion coefficient of the dimensionally stabilized mask supporting frame 34 is formed of material which is less than the thermal coefficient of expansion of material forming the mask which, in the preferred embodiment, is a metal foil mask. The reason that the thermal coefficient of expansion of the dimensionally stabilized mask supporting frame 34 is selected to be less than that of the mask 40 is that in one vapor deposition application for producing thin film magnetic transducers, the mask 40 generally is at a much lower or cooler temperature than the dimensionally stabilized mask supporting frame. This is a result of the heat balance relationships between the various previously discussed sources of heat being applied to the mask 40 and the ability of the mask 40 to lose that heat by radiation therefrom. In the preferred embodiment, if the thermal expansion coefficient of the flange 36 was greater than that of the mask 40, it is possible during operation that the thermal expansion of the flange 36 relative to the mask 40 could subject the mask to a tension which would be in excess of the yield strength of the mask material which would result in damage to the mask.

Another possible relationship is to have the temperature expansion coefficient of the dimensionally stabilized mask supporting frame 34 be greater than the thermal coefficient of expansion of the material forming the mask 40. This is desirable in a vapor deposition process which operates with the metal mask 40 at a substantially higher temperature. For example, if the source of vapor material operates at an extremely high temperature, a substantial amount of heat from the source will be radiated upon the mask causing the mask 40 to achieve a maximum temperature greater than the dimensionally stabilized mask supporting frame 34. Thus, if the thermal coefficient of expansion of the dimensionally stabilized mask supporting frame 34 was not sufficiently greater than that of the mask 40, the thermal expansion characteristics of the mask 40 could be great enough to relieve the tension in the mask 40 thereby permitting the mask to sag, resulting in loss of dimensional stabilization of the thin film pattern 46 and the introduction of variation in the mask-to-substrate distance.

The third possibility is to have the temperature expansion coefficient of the dimensionally stabilized mask supporting frame 34 to be substantially equal to that of the mask 40. Such an arrangement would be utilized where the temperature of the dimensionally stabilized mask supporting frame 34 and that of the mask 40 are substantially the same.

In operation, the temperature of the dimensionally stabilized mask supporting frame 34 can be critical for a number of important reasons. In the preferred embodiment, the substrate and substrate holding means may likewise be heated as will be explained in connection with the description of FIGS. 11 and 14, inclusive. In operation, it is desirable to have the substrate and the substrate holding means heated and maintained at a temperature which is likewise the operating temperature of the dimensionally stabilized mask supporting frame 34. By matching the temperature of the dimensionally stabilized mask supporting frame 34 to the temperature of the substrate 150 and substrate holding means 140, no heat transfer would occur between the dimensionally stabilized mask supporting frame 34 and substrate holding means 140, thereby enhancing thermal stability and dimensional stability of the apparatus. Thus, by regulating the amount of heat applied to the substrate holding means 140 and applied to the dimensionally stabilized mask supporting frame 34, an ideal operating condition exists to insure that the thin film of material deposited onto the substate in the thin film pattern 46 of the mask 40 would adhere to the substrate with a high coefficient of adhesitivity, due to the fact that the operating temperatures thereof are substantially the same.

Figure 11:
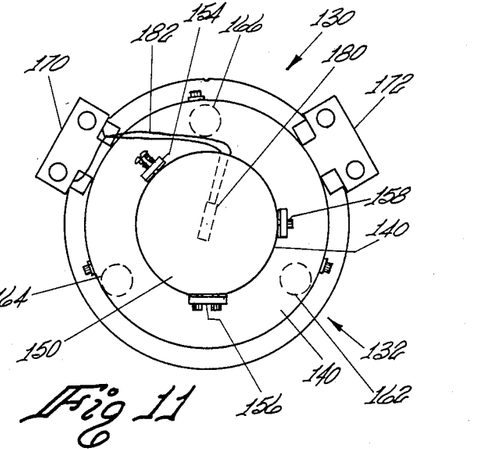
FIG. 11 is a bottom plan view of a gantry means having a substrate holding means which includes reference registration members and substrate support means for locating a substrate on the substrate holding means.
Figure 12:
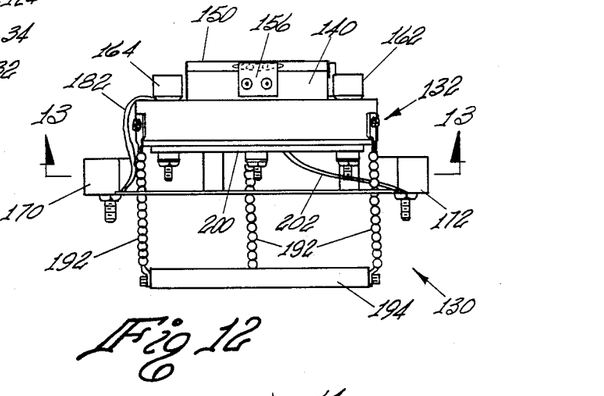
FIG. 12 is an end plan view of a gantry assembly which includes a gantry means having substrate holding means and substrate supporting means.

FIGS. 11 and 12 illustrate a portion of a gantry assembly 130 which includes a gantry means 132 which is formed of a substrate holding means 140. The substrate holding means 140 may comprise a block of high thermal conductivity material, such as for example copper, which is adapted to have a substrate supporting means shown generally as clamping and holding elements 154, 156, and 158. Electrical connecting means 170 and 172 are adapted to support and receive conductors which are utilized for both a substrate holding means heating means 200 and a temperature sensor 180. Temperature sensor 180 is operatively coupled by leads 182 to electrical connecting means 170.

Figure 13:
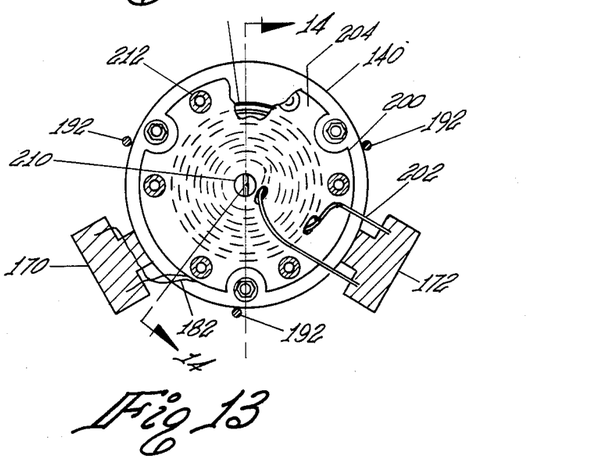
FIG. 13 is a section of the gantry means of FIG. 12 taken along section lines 13—thereof.

FIGS. 12 and 13 illustrate that the substrate heating means 200 has the leads of heating element 202 operatively coupled to terminal 172.

The substrate holding means 140 also provides a support for reference registration members 162, 164 and 166, shown by dashed circles in FIG. 11. In the embodiment illustrated in FIG. 11, reference registration member 162 is the primary reference registration member; reference registration member 164 is the secondary reference registration members and reference registration member 166 is the tertiary reference registration member. The reference registration members 162, 164 and 166 are utilized for accurately registering the gantry means including the substrate relative to the mask supporting apparatus which is illustrated in greater detail in FIGS. 21, 22 and 23.

FIG. 12 illustrates a gantry assembly 130 (in an inverted position for illustration purposes) and a gantry support platform 194 which utilize a plurality of flexible chain members 192 as a means for supporting a gantry means 132 for suspension therefrom and to permit the reference registration members 162, 164 and 166 to freely co-act with the prealigned registration members illustrated as 60 in FIG. 1, which are located on the mask supporting apparatus.

FIG. 13 illustrates in greater detail the relationship between the substrate holding means 140 and a substrate heating means 200. The substrate heating means 200 includes a heating element 202 which is formed, in the preferred embodiment, in a flat spiral positioned between the heating element clamping plate 204 and the substrate holding means 140. The heating element 202 may be constructed of the same material as that used for heating element 100 and which is capable of dissapating about 100 watts.

Figure 24:
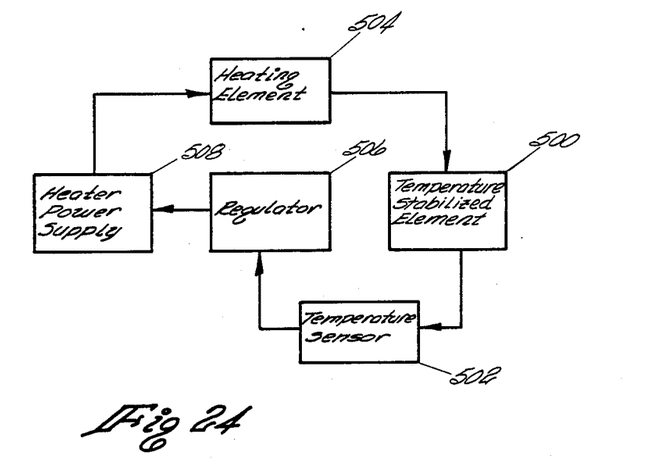
FIG. 24 is a block diagram showing a heating and maintaining means for a dimensionally thermally stabilized element such as the dimensionally stabilized mask supporting frame and/or substrate holding means.

The heating element 202 is operatively coupled to electrical connecting means 172 and electrical connecting means 172 is, in turn, adapted to electrically connect the heating element 202 to a heater power supply 508 (shown in FIG. 24) which is a part of the heating and maintaining means described in connection with FIG. 24. Also, FIGS. 11, 12 and 13 show the relationship between the leads 182 of the temperature sensing means 180 and their connection to the electrical connecting means 170. Also, the substrate heating means 200 is operatively coupled to the substrate holding means 140 by means of fasteners 210 and 212 which includes therewith spring washers illustrated as 214 in FIG. 14.

Figure 14:
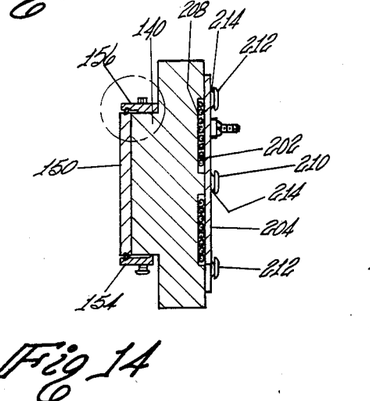
FIG. 14 is an end sectional view of the substrate holding means taken along section lines 14—14 of FIG. 13.

FIG. 14 shows that the substrate holding means 140 is adapted to have a channel 208 located therein which is adapted to receive and support the heating element 202 formed in a spiral format therein. The fasteners 210 and 212 are utilized to fasten the substrate heating means 200 to the substrate holding means 140 through tapped hole arrangements. Spring washers 214 are provided between the fasteners 210 and 212 and the heating element clamping plate 204 to permit the heating element 202 to expand and contract during the heating thereof. The movements of the above elements in response to thermal expansions are similar to the movements of heating element 100, heater element clamping housing 102, spring washers 124 and fastener 108 described herein in connection with FIG. 10.

The substrate supporting means 154 and 156 are illustrated in FIGS. 12 and 14 to support a relatively thick substrate 150 such that the substrate is clamped and held against the substrate holding means 140.

FIGS. 15a and 15b show in greater detail the relationship between the substrate holding means 140 and the relatively thick substrate 150. In one application, the substrate 150 is relatively thick and is adapted to have three shallow vee grooves 226, 230 and 252 formed in the periphery thereof. A fixed holding element 156 has a groove 222 formed therein which is adapted to cooperate with spherically shaped support members 224 which are positioned between the groove 222 in the fixed holding element 156 and the vee groove 226 formed in the periphery of the relatively thick substrate 150. Fasteners 228 are adapted to be threaded into tapped holes within the substrate supporting means 140 to fixedly support the substrate holding element 156 in position against the substrate holding means 140. When the fixed substrate holding element 156 has the spherically shaped support members 224 positioned against the groove, there are three contact suppport points for each spherically shapped support member, two of which are located along the grooves 222 formed on 156 and one of which is located on the surface of the vee groove 226 which is adjacent the substrate holding means 140.

FIG. 15b illustrates the relationship between the movable substrate clamping element 154 which has a groove 232 formed therein which is adapted to cooperate with a spherically shaped support member 236 which is adapted to be positioned between the groove 232 and the vee groove 230 formed in the relatively thick substrate 150. The moveable substrate clamping element 154 is adapted to be held in position by a fastener 240 which has a spring 242 positioned between the top of the fastener 240 and the moveable substrate clamping element 154. Fastener 240 is adapted to be secured to a tapped opening formed in substrate holding means 140.

Figures 15, 16, 17:
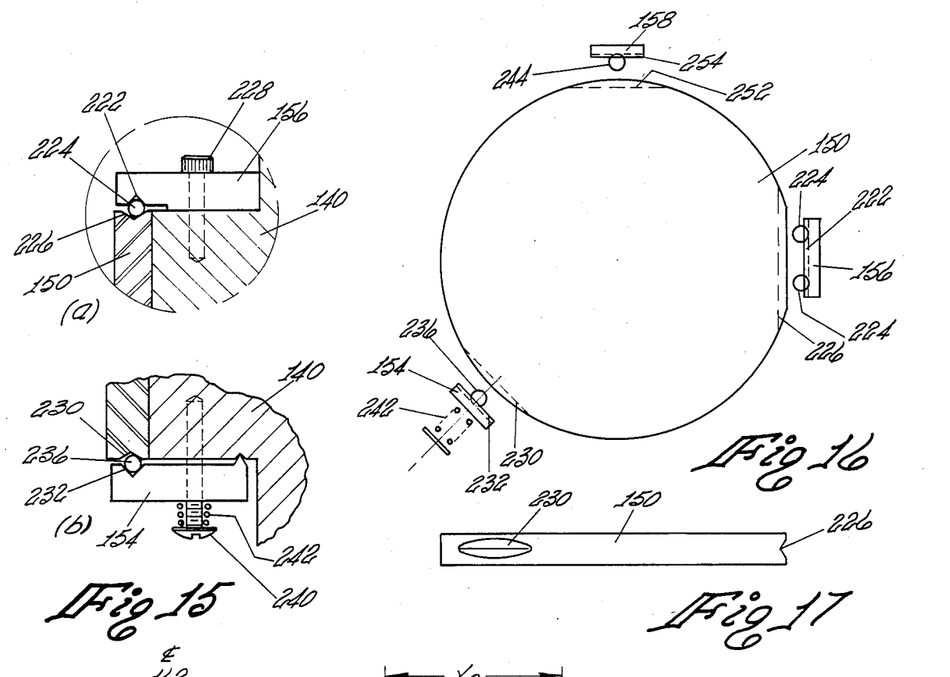
FIG. 16 is a pictorial representation of the substrate supporting means having three elements for clamping and holding a substrate to the substrate holding means which is part of the gantry means.
FIG. 17 is an end plan view of a relatively thick substrate showing the grooved sections located thereon to co-act with the substrate supporting means of FIG. 16.

FIGS. 16 and 17 pictorially illustrate the operation of the fixed substrate holding element 156 and its relationship with respect to the vee groove 226 formed in the periphery of the substrate 150. The spherical shaped support members 224 are adapted to be located between the vee groove 226 and the groove 222 formed in the fixed substrate holding element 156. Similarly, the movable substrate clampting element 154 has a groove 232 formed therein which was illustrated in FIG. 15a. A spherically shaped support member 236 is adapted to cooperate with the vee groove 230 formed in the periphery or edge of the substrate 150. The spring 242 is adapted to removably hold the movable substrate clamping element 154 in position such that the spherically shaped support member 236 is in removable securing relationship between the groove 232 and the vee groove 230.

A second fixed substrate holding element 158 has a vee groove 254 formed therein which is adapted to receive spherically shaped support member 244. Spherically shaped support member 244 is adapted to removably engage the vee groove 252 formed along the periphery of the substrate 150. Thus, for a relatively thick substrate 150, the substrate 150 has a plurality of vee grooves 226, 230, 252 formed therein which are adapted to receive and cooperative with spherically shaped support members 224, 236 and 244, respectively.

FIG. 17 illustrates an end plan view of the relatively thick substrate 150, the vee groove 230 and the vee groove 226. Vee groove 226 has an angle of approximately 120°.

Figure 18:
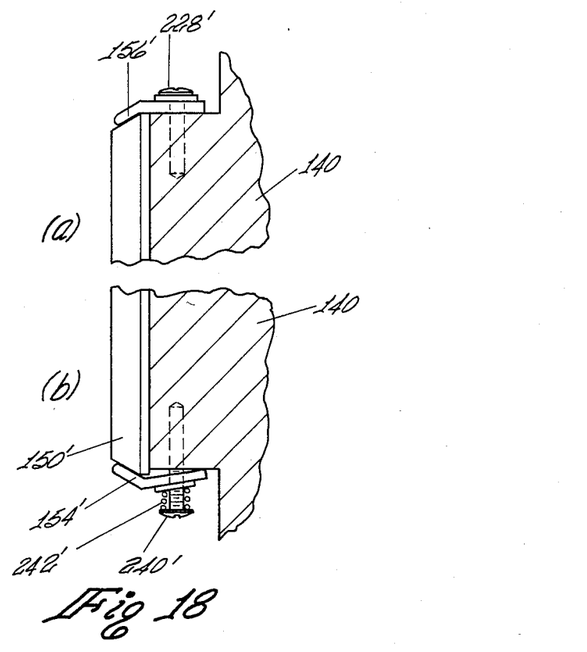
FIGS. 18a and 18b are enlarged partial sectional views of a substrate supporting means for a relatively thin substrate.

FIGS. 18a and 18b illustrate a substrate holding means for a relatively thin substrate 150'. The substrate holding means 140 is adapted to support a fixed substrate holding element 156' and a movable substrate clamping element 154'. The fixed substrate clamp 156' is held in position by fasteners 228' which are secured in tapped holes formed in the substrate holding means 140. In addition, the movable substrate clamping element 154' is held in position by fastener 240' which cooperates with a spring 242' to hold the movable substrate clamping element 154' in clamping relationship against the relatively thin substrate 150'. Fastener 240' is secured in a tapped opening in the substrate holding means 140.

Figure 19:
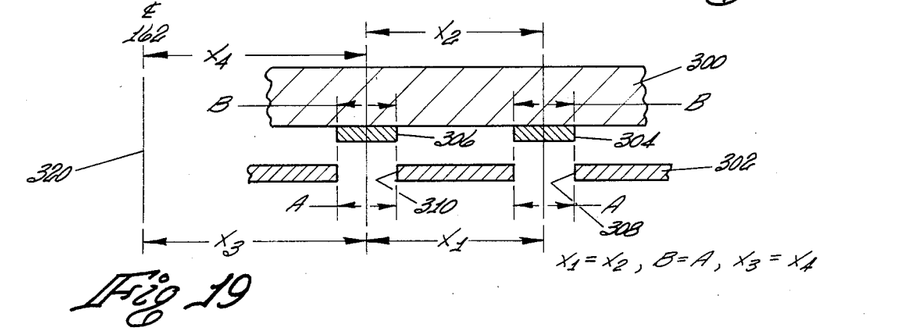
FIG. 19 is a pictorial representation of a substrate, a deposited thin film layer formed into a thin film pattern and of the substantially planar, tensioned mask in a precisely aligned relationship at a selected operating temperature of a deposition environment.

FIG. 19 illustrates a substrate 300 which has thin film material deposited in a pattern illustrated by deposits 304 and 306 adhered thereto. The deposits 304 and 306 correspond to and are defined by the apertures 308 and 310 formed in a mask 302. FIG. 19 is a pictorial representation of the substrate 300, deposits 304 and 306 and the substantially planar, tensioned mask 302 positioned in a precisely aligned relationship relative to each other at a selected operating temperature of a deposition environment. The precisely aligned relationship of the elements is depicted relative to the primary reference registration member 162 depicted by dashed line 320. In the representation of FIG. 19, precise alignment of registration occurs between the apertures 308 and 310 formed at mask 302 and the substrate 300 in order to permit depositing of the thin film layers into the patterns illustrated by deposits 304 and 306. The size of the apertures 308 and 310 are illustrated by "A" and the corresponding size of the deposited thin film deposits illustrated by 304 and 306 are illustrated by "B". The centerline of deposit 306 from the centerline 320 of primary reference registration member 162 is illustrated by "$X_4$" while the distance of the center of the aperture 310 is defined by "$X_3$". The distance between the center of the deposits 304 and 306 are illustrated by "$X_2$". The distance between the centerlines of the apertures 308 and 310 is illustrated by "$X_1$". In the illustration of FIG. 19, at the selected operating temperature, the criteria of the dimensions are that "$X_1$" is equal to "$X_2$", "B" equals "A" and "$X_3$" is equal to "$X_4$".

Figure 20:
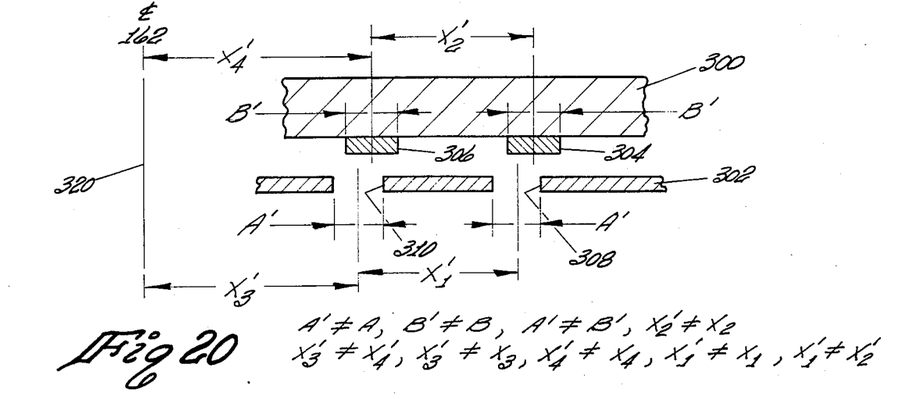
FIG. 20 is a pictorial representation of the components of FIG. 19 in other than a precisely aligned relationship at other than a selected operating temperature.

FIG. 20 illustrates the same components as illustrated in FIG. 19 at other than a precisely aligned relationship resulting from one or more of the elements being at other than the selected operating temperature. In essence, the coefficients of thermal expansions of each of the elements, the temperatures of the process to which each element is exposed and the relationship therebetween are all critical in establishing either precise alignment or the resulting misalignment which can occur. The illustration in FIG. 20 can occur either at room temperature or at an operating temperature which is other than at the selected temperature. At other than the selected temperature, the components will establish a relationship relative to each other which is a function of the thermal coefficients of expansion of such elements, the specific temperatures to which the elements are exposed in the deposition process such as, for example, in FIG. 20, it is illustrated that the stabilized mask assembly supporting the mask 302 may be cooler or the substrate holding means including the substrate 300 being hotter, both being relative to the selected temperature. As is apparent from the representations illustrated by the distances which are denoted with the same designation as in FIG. 19 except that FIG. 20 is illustrated with the same dimensions with a "'" to illustrate the same dimensions. Of importance, is that at other than at the selected operating temperature, each of the positions of the components vary relative to each other for the reasons set forth above such that virtually all of the dimensions are unequal as illustrated in FIG. 20.

Thus, FIGS. 19 and 20 illustrate the complex alignment problems which are encountered due to variations in the operating temperature and varying thermal environments in a vapor deposition process. For purposes of illustration, the deposits 302 and 304 do not show the effects of the divergence of the evaporated vapor from the source.

All of the components are positioned in an exact relationship relative to each other at the selected operating temperature such that duplication of the process and precise alignment between the mask and substrate can be obtained by operating and maintaining the process at the selected operating temperature. By operating a process at the selected operating temperature and insuring that each of the components exhibit the same dimensional relationship relative to each other at that selected operating temperature, duplication, repeatability and accuracy of the dimensionally stabilized mask supporting frame and its associated relatively thin, substantially planar mask 302, under tension, is obtained. In a multi-step process, it is possible to obtain very accurate and precise alignment between various deposited thin film layers of material, particularly when it is necessary to precisely register a plurality of deposited layers relative to each other.

As is illustrated in FIGS. 19 and 20, the distance between the substrate 300 and mask 302 is maintained at a substantially fixed dimension, thereby eliminating variations in the depositions which would otherwise occur with respect to the deposits 304 and 306, from divergence and other physical properties of the evaporated vapor from the source and changes in the mask-to-substrate distance.

Figure 21:
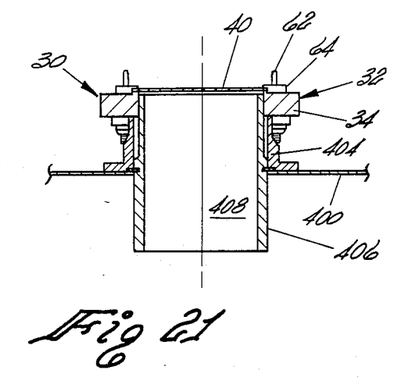
FIG. 21 is an end sectional view of a mask supporting apparatus which is mounted within a mask supporting frame for shielding the mask supporting apparatus.
Figure 22:
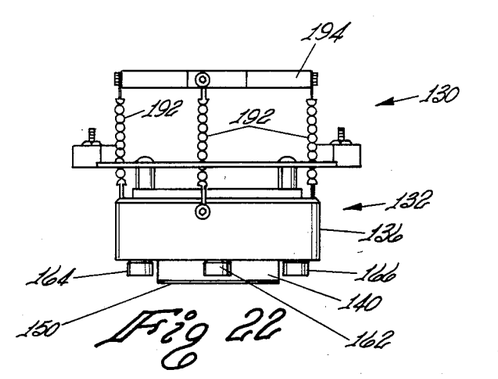
FIG. 22 is an end plan view of a gantry assembly which includes a gantry means having a substrate holding means.
Figure 23:
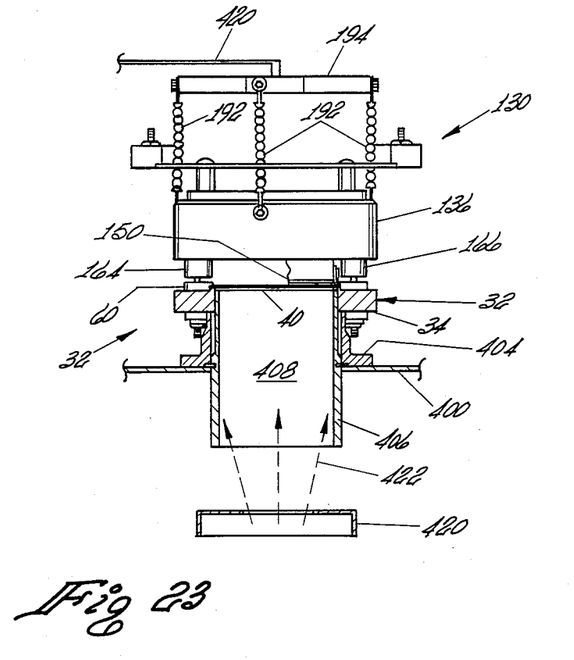
FIG. 23 is an end plan view partially in section showing a gantry means co-acting with a stabilized mask assembly through prealigned registration members and referenced registration members.

FIGS. 21, 22, and 23 illustrate one embodiment of a means for accurately registering the mask supporting apparatus 30 relative to a gantry assembly 130. FIG. 21 illustrates one embodiment wherein the mask supporting apparatus 30 is positioned within a mask supporting frame 400 by means of a mask supporting frame housing 404. The mask supporting apparatus 30 includes the dimensionally stabilized mask supporting frame 34 which includes thereon the prealigned registration members which include the registration pin 62 and adjusting means 64. The mask 40 is rigidly affixed to the dimensionally stabilized mask supporting frame 34 and positioned in alignment with opening 70 shown in FIGS. 2, 5 and 7. A shielding means 406 which is adapted to shield the dimensionally stabilized mask supporting frame 34 from a vapor deposition source provides a passageway 408 through which a vapor of deposition material 422 can pass from an evaporation source 420 through the passageway 408 defined by the shielding means 406 through the mask 40 and onto the substrate 150.

FIG. 22 illustrates a gantry assembly 130 which includes the gantry means 132 which is supported from the gantry support platform 194 by flexible chain members 192 and the substrate holding means 140. The gantry means 132 includes reference registration members 162, 164 and 166 which were earlier described in connection with FIG. 11.

FIG. 23 shows a gantry assembly 130 co-acting with a mask supporting apparatus 30 having the mask supporting apparatus 30 supported by the mask supporting frame 400. A gantry actuating means shown by member 420 is operatively coupled to the gantry support platform 194. Movement of the gantry actuation means 420 away from the mask supporting frame 400 results in the withdrawal of the gantry assembly 130, including the substrate 150, away from the mask 40. Likewise, the gantry actuating means 420 is adapted to move the gantry support platform 194, which is located above the gantry assembly 130, towards the stablized mask assembly 32 which permits the reference registration members 162, 164, and 166 to co-act with the prealigned registration members 60 located on the stabilized mask assembly 32 which together define the mask supporting apparatus 30. The evaporation source 420 produces a vapor of deposition material designated by arrows 422 which passes through passageway 408 in shielding means 406 and through the mask 40 to deposit a thin film layer of material in a pattern on the substrate 150.

As described in connection with FIGS. 8 and 13, the stabilized mask assembly 32 and the gantry means 132 are adapted to have a means for heating and maintaining the dimensionally stabilized mask supporting frame 34 and the substrate holding means 140, respectively, at a selected operating temperature which may be characterized as a stabilized operation temperature. FIG. 24 illustrates by means of a block diagram that the temperature stabilized element 500 has a temperature sensor 502, associated therewith, represented in practice as temperature sensors 120 in FIG. 8 and 180 in FIG. 11, which senses the temperature of the temperature stabilized element 500. A heating element 504, represented as a heating elements 100 in FIG. 8 and 202 in FIGS. 13 and 14, is utilized to apply the required amount of heat to the temperature stabilized element 500. A regulator 506 which is responsive to the temperature sensor 502 controls the heater power supply 508 to control the power dissipated in element 504. By use of the system illustrated in FIG. 24, means are provided to heat and maintain the temperature of the temperature stabilized element 500 which may be the dimensionally stabilized mask supporting frame 34 or the substrate holding means 140 at a controlled operating temperature. The heating and maintaining means illustrated in FIG. 24 is adapted as a means for heating and maintaining the substrate 150 and a substrate holding means 140 at a selected operating temperature which is at least equal to the temperature that the dimensionally stabilized mask supporting frame 34 would achieve in the deposition process independent of the heating means. Also, the heating means illustrated in FIG. 24 can be utilized as a means for heating and maintaining the dimensionally stabilized mask supporting frame 34 at a selected stabilized operating temperature which thermally dimensionally stabilizes the stabilized mask supporting frame, and thereby the mask at the dimension which occurs at the selected stabilized operating temperature.

A method for fabricating a stabilized mask assembly 32 adapted for direct deposition of a thin film pattern on a substrate can be utilized in practice in the invention. The method includes a step of applying a substantially uniform tension to a substantially planar metal foil 40' of FIG. 2 having a predetermined yield strength and selected geometrical shape and dimension and rigidly affixing the metal foil 40', illustrated in FIG. 2, to a circumferentially extending surface of a dimensionally stabilized mask supporting frame 34 having an opening 70 extending therethrough. The value of the initial substantially uniform tension is selected such that the magnitude of stress imposed on the mask 40 during use is less than the predetermined yield strength of the mask 40 over a temperature range of a deposition process including operating temperatures of a deposition environment. At the operating temperatures, the dimensionally stabilized mask supporting frame 34 is adapted to maintain the tension on the mask 40 and is of sufficient magnitude to keep the mask 40 under tension independent of variations in the tension due to the thermal expansion characteristics of the mask 40 to dimensionally stabilize the thin film pattern 46 formed on the mask 40 at the operating temperatures of a deposition environment. The above method can further comprise the step of forming a plurality of apertures 44 of FIG. 1 through the mask 40 of FIG. 1 which are arranged in a predetermined array to define the thin film pattern 46.

One method which can be utilized for forming the plurality of apertures includes the steps of applying an imageable and developable photoresist coating on at least one surface of the metal foil 40'; imaging the photoresist coating with an image in the form of a predetermined array; developing the imaged photoresist coating to form a photoresist pattern exposing portions of the metal foil 40' which are to be removed to form apertures 44 arranged in said predetermined array and selectively removing exposed portions of the metal foil 40' to form the apertures 44 in the predetermined array to define a thin film pattern 46.

In addition, an alternate method of forming the plurality of apertures includes cutting the metal foil 40' with a laser.

Another method of forming the metal foil 40' with apertures 44 is by electroforming.

Another alternative method of forming the plurality of apertures includes the step of milling the metal foil 40' with an ion beam.

The step of forming the plurality of apertures by cutting the metal foil with a laser, milling with an ion beam, or etching using photoresist techniques, can occur either before the step of rigidly affixing the metal foil 40' to the dimensionally stabilized mask supporting frame 34 or, in the alternative, after the mask 40 has been rigidly attached to the dimensionally stabilized mask supporting frame 34.

A method of fabricating a stabilized mask assembly for direct deposition of a thin film pattern onto a substrate is likewise provided herein. The method includes the step of applying a radial tension force to a relatively thin, substantially planar metal foil 40' having a predetermined yield strength and selected geometrical shape and dimension. The substantially planar metal foil 40' has at least one aperture extending therethrough which is arranged in a predetermined location defining a thin film pattern 46. The value of the initial substantially uniform radial tension is selected such that the magnitude of stress imposed on the mask 40 during use is less than the predetermined yield strength of the mask 40 over a temperature range of a deposition process including the operating temperatures of a deposition environment. The tension is of sufficient magnitude to keep the mask under tension independent of variations in the radial tension due to the thermal expansion characteristics of the mask to dimensionally stabilize the thin film pattern at the operating temperatures of a deposition environment. The method then includes the step of rigidly affixing the periphery of the metal foil mask 40' to a circumferentially extending surface located around the opening 70 of the dimensionally stabilized mask supporting frame 34 while the tension force is applied to the metal foil mask 40'. The above method can utilize the step of rigidly affixing the periphery of the metal foil mask 40' to the circumferentially extending surface by the step of welding the periphery of the metal foil mask 40' to the dimensionally stabilized mask supporting frame 34. In the alternative, a method can utilize the step of rigidly affixing the periphery of the metal foil mask 40' to the circumferentially extending surface by including the step of clamping the periphery of the metal foil mask 40' by a clamping member 88 against the dimensionally stabilized mask supporting frame 34, both illustrated in FIG. 7, to maintain a radial tension in the metal foil mask 40'. An alternate method of welding the periphery of the metal foil mask 40' to the dimensionally stabilized mask supporting frame 34 can utilize a controlled laser.

The method of thermally dimensionally stabilizing a mask having a thin film pattern formed therein and which is accurately registered to a substrate is likewise disclosed by this invention. This method includes the steps of forming a dimensionally stabilized mask supporting frame having an opening extending through the center thereof and means defining a circumferentially extending surface around the periphery of the opening; applying an initial substantially uniform tension to a substantially planar metal foil having a predetermined yield strength and selected geometrical shape and dimension; rigidly affixing the metal foil to the circumferentially extending surface of the stabilized mask supporting frame wherein the substantially uniform tension is selected such that the magnitude of stress imposed on the mask during use thereof in a vapor deposition process is less than the predetermined yield strength of the mask over a temperature range of a deposition process including operating temperatures of a deposition environment and being adapted to maintain a tension thereon of sufficient magnitude to keep the mask under tension independent of variations in radial tension due to the thermal expansion characteristics of the mask to dimensionally stabilize the thin film pattern at the operating temperatures of a deposition environment; heating and maintaining with a first heating means the substrate and substrate holding means at a selected operating temperature which is at least equal to that temperature the dimensionally stabilized mask supporting frame would achieve in a deposition process independent of heating with a second heating means and heating and maintaining with said second heating means the dimensionally stabilized mask supporting frame at a selected stabilized operating temperature which thermally dimensionally stabilizes the stabilized mask supporting frame at the dimension which occurs at the selected stabilized operating temperature.

The above method can further include the step of shielding the thermally dimensionally stabilized mask supporting frame to reduce the operating temperatures thereof which would occur independent of the heat from the second heating means. Also, the method would include establishing the operating temperature of the dimensionally stabilized mask supporting frame and the substrate and substrate holding means at the maximum operating temperature that the dimensionally stabilized mask supporting frame would achieve in the deposition process independent of the heat from the second heating means. The method can further include the step of heating and maintaining the substrate and substrate holding means utilizing the first heating means and the step of heating and maintaining the dimensionally stabilized mask supporting frame with the second heating means to controllably apply sufficient heat thereto to maintain both of the same at a temperature in excess of the maximum operating temperature.

As disclosed and set forth herein, the various components which are utilized in the apparatus and method in a deposition process must be dimensionally stabilized relative to each other in order to obtain the desired accuracy that is necessary in order to deposit one or more layers of material in a thin film pattern onto a substrate. In a deposition process, it is difficult to control the temperature of a mask. Accordingly, it is necessary that the dimensionally stabilized mask supporting frame which supports the tensioned mask be selected to have the appropriate properties including the appropriate thermal coefficient of expansion relative to the material forming the mask and that the dimensionally stabilized mask supporting frame is either a relatively dimensionally stable element over the operating temperatures of the vapor deposition process or, in the alternative, that the dimensionally stabilized mask supporting frame is formed of a material which has a known coefficient of thermal expansion which permits the dimensionally stabilized mask supporting frame to be operated at a selected operating temperature which establishes and, if necessary, is capable of precisely reestablishing dimensional stability at that selected operating temperature.

A stabilized mask assembly having a substantially planar, tensioned mask is adapted for use in a deposition process. In multi-step deposition processes, a plurality of mask supporting apparatus each having a tensioned mask rigidly afixed thereto can be separately indexed relative to a working station which may include a vapor deposition source and substrate. Upon completion of indexing of a selected stabilized mask assembly to the working station, accurate registration of the stabilized mask assembly relative to the substrate can be made through the pre-aligned registration members co-acting with the reference registration members such that the substrate can be positioned precisely relative to the mask pattern. Maintaining the temperature of both the substrate and substrate holding means at a temperature which is substantially equal to the temperature of the dimensionally stabilized mask supporting frame, which temperature is controllably selected to be a higher temperature than the maximum temperature that the dimensionally stabilized mask supporting frame would reach in a deposition process independent of the heating means, permits an accurate and repeatable registration of a thin film pattern formed on a mask relative to one or more substrates to permit precise and controllable registration between the mask and substrate including prior and post deposited thin film layers formed using the same mask or a plurality of masks.

To dimensionally stabilize the mask supporting apparatus, the mask supporting apparatus and methods disclosed herein have utility in the fabrication of multilayer thin film components and devices including, without limitation, thin film tranducers, conductors, capacitors and the like.

What is claimed is:

1. A stabilized mask assembly for direct deposition of a thin film pattern on a substrate comprising
   a dimensionally stabilized mask supporting frame which maintains its geometrical dimensions over the temperature range at which the direct deposition of a thin film pattern on a substrate is performed having an opening extending therethrough and means defining a surface extending circumferentially around the opening;
   a relatively thin, substantially planar mask having a predetermined yield strength and selected geometrical shape and dimension, said mask being positioned adjacent said opening with the periphery of the mask circumferentially contiguous said circumferentially extending surface, said mask having at least one aperture extending therethrough and being arranged in a predetermined location defining a thin film pattern; and
   means for rigidly affixing a selected portion of the periphery of said mask to said circumferentially extending surface to maintain therearound a substantially uniform initial isotropic tension applied to and in the plane of said mask, said initial isotropic tension having a magnitude which establishes a stress on the mask during use which is less than the predetermined yield strength of said mask when said mask is used over a temperature range of a deposition process including operating temperatures of a deposition environment and being adapted to maintain tension thereon of sufficient magnitude to keep the mask under tension independent of variations in tension due to the thermal expansion characteristics of the mask to dimensionally stabilize and maintain the relative position of said thin film pattern to the substrate at a said operating temperature of a depostion environment.

2. The stabilized mask assembly of claim 1 wherein said substantially planar mask is formed of a metal foil.

3. The stabilized mask assembly of claim 1 wherein said means for rigidly affixing the periphery of said mask to said circumferentially extending surface is a weld which is integral with the circumferentially extending surface and mask.

4. The stabilized mask assembly of claim 1 wherein said means for rigidly affixing the periphery of said mask to said circumferentially extending surface is a clamping member having a clamping surface and opening which extends therethrough and wherein said clamping member surface is adapted to cooperate with said circumferentially extending surface to clamp the periphery of said mask to urge the same against the circumferentially extending surface to clamp the periphery of the mask between the clamping member and the stabilized mask supporting frame to maintain a said tension in said mask.

5. The stabilized mask assembly of claim 1 wherein said circumferentially extending surface terminates in a raised ridge located around the periphery of said opening and wherein said means for rigidly affixing the periphery of said mask to said circumferentially extending surface is a clamping member having an outer support flange and means defining a clamping member opening which extends therethrough, said clamping member opening having a geometrical dimension which is substantially equal to the geometrical dimension of the opening of said mask supporting frame, said outer support flange having one edge thereof which terminates in a raised boss member defining a clamping yoke having a geometrical dimension substantially equal to the sum of the dimension of said opening in said mask supporting frame, twice the width of the circumferentially extending raised ridge around the periphery of said opening in said mask supporting frame and an allowance for the thickness of said mask, said raised boss member being adapted to slideably mate with said circumferentially extending raised ridge with the periphery of said mask therebetween and to clamp the periphery of the mask between the outer support flange and the mask supporting frame and to maintain a radial tension to the mask.

6. The stabilized mask assembly of claim 2 wherein said metal foil mask has a yield strength of approximately 200,000 pounds per square inch.

7. The stabilized mask assembly of claim 1 wherein said mask supporting frame is selected of a material having a thermal coefficient of expansion which is higher than the thermal coefficient of expansion of the mask.

8. The stabilized mask assembly of claim 1 wherein said mask supporting frame is selected of a material having a thermal coefficient of expansion which is substantially equal to the thermal coefficient of expansion of the mask.

9. The stabilized mask assembly of claim 1 wherein said mask supporting frame is selected of a material having a thermal coefficient expansion which is less than the thermal coefficient expansion of the mask.

10. Mask supporting apparatus comprising
    a stabilized mask assembly including
       a dimensionally stabilized mask supporting frame which maintains its geometrical dimensions over the temperature range at which the direct deposition of a thin film pattern on a substrate is performed having an opening extending through the center thereof and means defining a circumferentially extending surface around the periphery of said opening on one side of the dimensionally stabilized mask supporting frame, said dimensionally stabilized mask supporting frame including means for defining a frame flange which supports said circumferentially extending surface;
       a relatively thin, substantially planar mask formed of material having a predetermined yield strength and a selected geometrical shape and dimension, said mask being positioned adjacent said opening with the periphery thereof contiguous said circumferentially extending surface, said mask having a plurality of apertures extending therethrough and arranged in a predetermined array defining a thin film pattern;
       means for rigidly affixing a selected portion of the periphery of said mask to the circumferentially extending surface to maintain therearound an isotropic tension applied to said mask, said isotropic tension having a magnitude which establishes a stress on the mask during use which is less than the predetermined yield strength of a said mask when said mask is used over a temperature range of a deposition process including operating temperatures of a deposition environment and being adapted to maintain sufficient magnitude to keep the mask under tension independent of variations in tension due to thermal expansion characteristics of the mask to dimensionally stabilize dimensionally stabilize and maintain the relative position of said thin film pattern to the substrate at a said operating temperature of a said deposition environment; and prealigned registration members located on the frame flange of said dimensionally stabilized mask supporting frame.

11. The mask supporting apparatus of claim 10 wherein at least two of each of said prealignment registration members include
a registration pin; and
adjusting means operatively coupled to said registration pin and to said frame flange for moveably adjustably securing said registration pin relative to said frame flange and being adapted to adjust said registration pin location relative to the thin film pattern.

12. The mask supporting apparatus of claim 10 wherein said circumferentially extending surface on said dimensionally stabilized mask supporting frame is in the form of a raised ridge.

13. The mask supporting apparatus of claim 10 wherein said planar mask is formed of a metal foil.

14. The mask supporting apparatus of claim 10 wherein said stabilized mask assembly includes
means operatively coupled to said stabilized mask supporting frame for heating the same to maintain the magnitude of the radial tension on said mask at a magnitude which is sufficient to maintain the mask under tension independent of the variations in radial tension due to the thermal expansion characteristics of said mask at said operating temperatures in a deposition environment.

15. The mask supporting apparatus of claim 14 wherein the means for heating the stabilized mask supporting frame includes means for maintaining the stabilized mask supporting frame at an operating temperature which is at least equal to the maximum operating temperature that the dimensionally stabilized mask supporting frame would achieve in the deposition process independent of said heating means.

16. The mask supporting apparatus of claim 15 wherein said means for maintaining an operating temperature maintains the operating temperature at a selected stabilized operating temperature which thermally dimensionally stabilizes the stabilized mask supporting frame at the dimension which occurs at the selected stabilized operating temperature.

17. The mask supporting apparatus of claim 15 wherein said operating temperature is selected to be substantially the same temperature as that temperature of a said substrate having a substrate operating temperature which is at least equal to that of said maximum operating temperature.

18. The mask supporting apparatus of claim 10 wherein said stabilized mask supporting frame is selected of a material having a thermal coefficient of expansion which is less than the thermal coefficient of expansion of a said mask.

19. The mask supporting apparatus of claim 11 wherein said stabilized mask supporting frame includes means for defining a plurality of supporting apertures extending through the frame flange, each of said supporting apertures having an axis which is in parallel axial alignment with the axis of a said opening of said dimensionally stabilized mask supporting frame and each are in spaced axial alignment with each other and wherein said adjusting means are located in at least two of said supporting apertures and are adapted to independently position its associated prealigned registration member relative to said thin film pattern.

20. Apparatus for accurately registering a substrate to a stabilized mask for direct deposition of a thin film material onto the substrate through a stabilized mask having said thin film pattern formed therein, said apparatus comprising
a mask supporting apparatus including
a stabilized mask assembly having a dimensionally stabilized mask supporting frame which maintains its geometrical dimensions over the temperature range at which the direct depostion of a thin film pattern on a substrate is performed having an opening extending through the center thereof and means defining a circumferentially extending surface around the periphery of a said opening on one side of the stabilized mask supporting frame, said dimensionally stabilized mask supporting frame including means for defining a frame flange which supports said circumferentially extending surface;
a relatively thin, substantially planar mask formed of material having a predetermined yield strength and a selected geometrical shape and dimension, said mask being positioned adjacent said opening with the periphery thereof contiguous said circumferentially extending surface, said mask having a plurality of apertures extending therethrough and arranged in a predetermined array defining a thin film pattern;
means for rigidly affixing a selected portion of the periphery of said mask to the circumferentially extending surface to maintain therearound initial isotropic tension applied to said mask, said initial isotropic tension having a magnitude which establishes a stress on the mask during use which is less than the predetermined yield strength of a said mask when said mask is used over a temperature range of a deposition process including operating temperatures of a deposition environment and being adapted to maintain sufficient magnitude to keep the mask under tension independent of variations in isotropic tension due to the thermal expansion characteristics of the mask to dimensionally stabilize and maintain the relative position of said thin film pattern to the substrate said thin film pattern at a said operating temperature of a said deposition environment;
prealigned registration members located on the frame flange of said dimensionally stabilized mask supporting frame; and
gantry means including a substrate holding means for supporting a substrate in a predetermined relationship to a said source, said gantry means including means for positioning and accurately registering a said substrate relative to said dimensionally stabilized mask supporting frame, said gantry means including reference registration members which are adapted to co-act with the prealigned registration members for accurately registering a said substrate in a precise position relative to said mask supported by said dimensionally stabilized mask supporting frame, said reference registration members being adapted to co-act with said prealigned registration members to insure that a said substrate is accurately registered relative to the mask rigidly affixed to said dimensionally stabilized mask supporting frame.

21. The apparatus of claim 20 further comprising means for heating and maintaining a said substrate and said substrate holding means to a selected stabilized operating temperature which is at least equal to that temperature the dimensionally stabilized mask supporting frame would achieve in the deposition process independent of any heating and maintaining means being applied to said dimensionally stabilized mask supporting frame; and means for heating and maintaining the dimensionally stabilized mask supporting frame to said selected stabilized operating temperature which thermally dimensionally stabilizes the dimensionally stabilized mask supporting frame at the dimension which occurs at said selected stabilized operating temperature.

22. The apparatus of claim 20 wherein said planar mask is formed of a metal foil.

* * * * *